MICROWAVE SWITCH

Filed Oct. 29, 1962

2 Sheets-Sheet 1

INVENTORS
ROBERT D. HALL
RONALD D. STEWART
BY John L Fawler
ATTORNEY

INVENTORS
ROBERT D. HALL
RONALD D. STEWART
BY John F. Fowler
ATTORNEY 3,179,816
MICROWAVE SWITCH Robert D. Hall, Los Altos, and Ronald D. Stewart, San Jose, Calif., assignors to Sylvania Electric Products Inc., a corporation of Delaware Filed Oct. 29, 1962, Ser. No. 233,788
8 Claims. (Cl. 307—88.5)

This invention relates to microwave switches and more particularly to a diode switch capable of switching radio frequency power in less than 10 nanoseconds.

Advances in electronic and space sciences have produced many applications that require switching of microwave signals in the order of a few nanoseconds. For example, pulse radar altimeters require such fast switching in order to accurately indicate altitudes of less than a few hundred feet. Heretofore switches having such short switching time capability have not been available. This invention is directed toward the provision of such a switch.

A general object of the invention is the provision of a microwave switch which can be switched from its "off" state to its "on" state in less than ten nanoseconds.

Another object is the provision of a semiconductor diode switch in which the switch junction is not only matched to the transmission line but is also matched to both input and output lines of the control signal circuit.

A specific object is the provision of a microwave coaxial diode switch having a switching time in the order of four nanoseconds.

Another object is the provision of a semiconductor diode switch that is compact and lightweight and which is readily reproducible.

In accordance with the invention, a switch junction comprising a semiconductor diode is located in a microwave transmission line in such a manner as to block or pass microwave energy propagating on the line depending on the switching state of the diode. In a preferred embodiment of the invention, the switch junction is included in series with the center conductor of a coaxial transmission line and the diode is rendered conducting to pass an incident radio frequency signal or non-conducting to block the incident radio frequency signal by a switching signal applied to a control line connected to the center conductor. The control line has an input branch connected on one side of the switch junction and an output branch connected to the other side. The output branch, as well as the input branch, of this control line is matched to the switch junction so that the control signal which triggers the switch passes through the entire control line including the diode without producing reflections when the diode is conducting.

The frequencies of the radio frequency signal and the control signal are separated so as to prevent interference. Filters in the control and transmission lines isolate these lines from the radio frequency and control signals, respectively. The input and output control lines are designed to have a sufficiently broad bandwidth to pass all of the frequency components that make up a control pulse of a predetermined rise time. The switch junction has a high switching ratio (ratio of isolation to insertion loss) over the radio frequency signal band, and includes means for adjusting its inherent capacitive and inductive reactances in order to precisely control the frequency band over which the switch is to operate.

The invention will be more fully understood from the following description of a preferred embodiment thereof, reference being had to the accompanying drawings in which.

Figure 2:
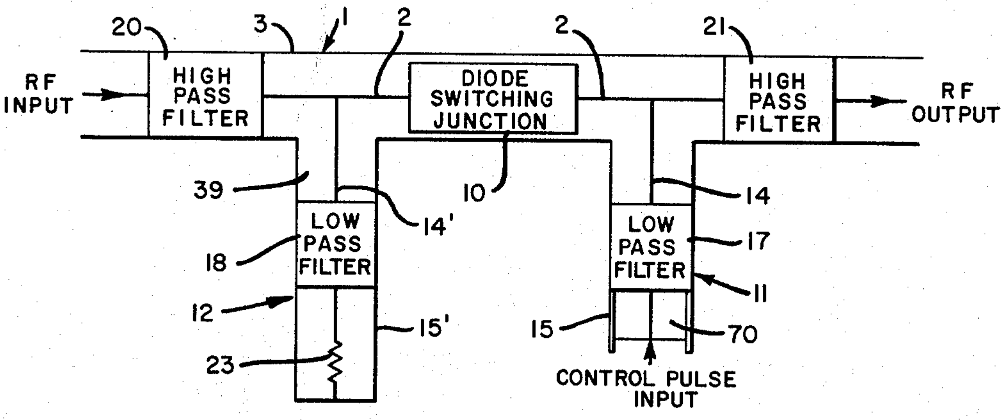
FIGURE 2 is a block diagram of a switching system embodying this invention.
Figure 3:
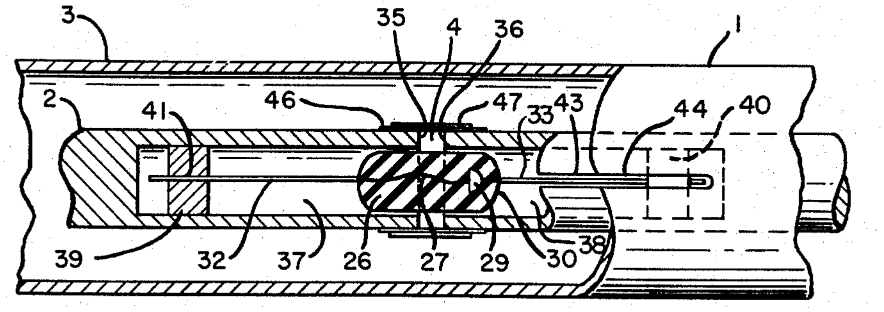
FIGURE 3 is an enlarged longitudinal section of the switch junction.
Figure 3A:
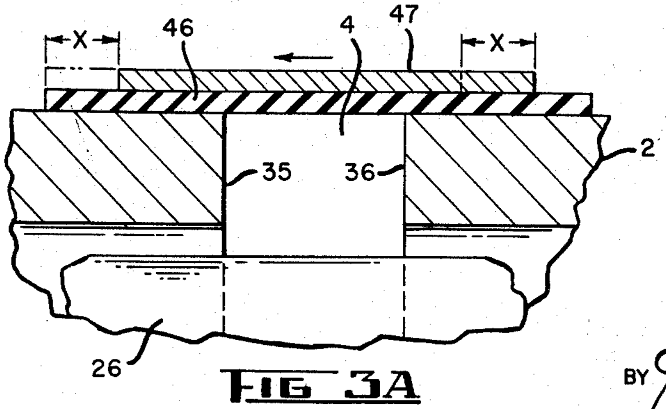
Figures 6, 7:
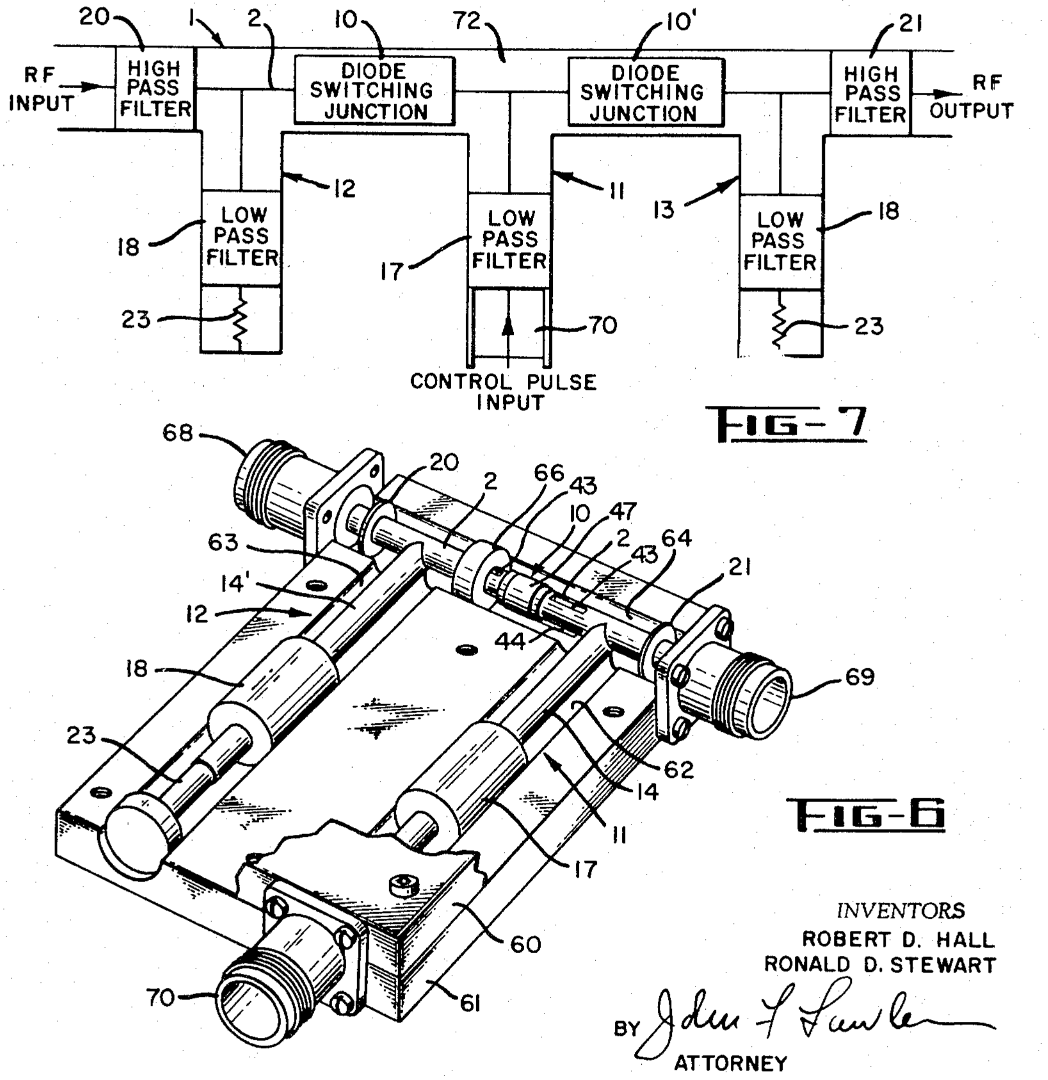

FIGURE 3*a* is a greatly enlarged portion of FIGURE 3 illustrating the adjustability of the capacitance of gap 21;

FIGURES 4*a* and 4*b* are circuit equivalents of a typical semiconductor diode in the forward biased and reverse biased states, respectively;

FIGURES 5*a* and 5*b* are the circuit equivalents of the switch junction of FIGURE 3 in the forward biased and reverse biased states, respectively;

FIGURE 6 is a perspective view of an actual switch of the type shown in FIGURE 2 with the top plate broken away to show the internal construction; and FIGURE 7 is a block diagram of a modified form of the invention featuring two switch junctions.

Figure 1:
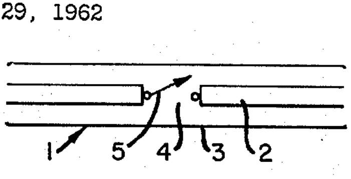
FIGURE 1 is a drawing illustrating a series connected switch in the center conductor of a coaxial line.

Referring now to the drawings; FIGURE 1 is a simplified schematic drawing of a coaxial transmission line 1 having a center conductor 2 with a gap 4 and switching element designated by an arrow 5 defining a switch junction. When this junction is "open" as indicated by the position of the arrow 5 in FIGURE 1, the transmission of radio frequency signals on the line is blocked and the signals are reflected by the high impedance of and mismatch on the line at the junction. When the switch junction is closed so that the center conductor is essentially continuous, the impedance of the line at the junction is very low and microwave signals propagate through the line with relatively low loss. A fast acting switch must therefore be capable of presenting both a high and a low impedance to the transmitted energy and must be able to change from the one state to the other in the shortest possible time.

A preferred form of the invention is shown in FIGURE 2 and comprises a switch junction 10 located within coaxial line 1, a control line 11 connected to coaxial line 1 on one side of junction 10, and a control output line 12 similarly connected to the coaxial line on the other side of junction 10. The control input and output lines 11 and 12 are coaxial lines having inner conductors 14 and 14' and outer conductors 15 and 15', respectively. A bias potential is applied through input line 11 to maintain the diode of junction 10 in one of its conduction states. A control pulse superimposed on the bias potential controls the switching of the junction. Radio frequency signals to be controlled are transmitted on coaxial line 1 from left to right as viewed. Control lines 11 and 12 contain low-pass filters 17 and 18, respectively, and transmission line 1 has high-pass filters 20 and 21 on the input and output sides, respectively, of the connection of control lines 12 and 11 to the transmission line. Control output line 12 is terminated in a matched load 23. When low-pass filters 17 and 18 are capacitive input pi section filters, they are located approximately one quarter wave length from center conductor 2 of coaxial line 1, determined at the center frequency over which the switch is to operate. The low impedance or short circuit of the input capacitor of the filter appears as a high impedance or open circuit between the center conductor 2 and outer conductor 3 of coaxial line 1 to a radio frequency signal on the line 1 to block it from the control line.

The switching action of junction 10 is controlled by a pulse having a rise time less than the desired switching time of the switch and applied to the input control line 11. Assuming the diode of junction 10 is biased to conduct, the pulse passes through filter 17 to coaxial line 1, through junction 10 to switch the diode, through coaxial line 1 and filter 18 of output line 12 and is absorbed in termination 23. Filters 17 and 18 are designed to pass without reflection control pulses having rise times in the order of the switching times sought to be achieved. In other words, if a switching time of four nanoseconds is desired, the bandwidth of filters 17 and 18 is sufficient to pass the frequency components which make up a control pulse having a rise time of less than four nanoseconds. The frequencies of the components that comprise the control pulse are different from or spaced from the radio frequency signals being switched. High-pass filters 20 and 21 are designed to block the control pulse from and pass the RF signal on coaxial line 1. Similarly, low-pass filters 17 and 18 block the transmission of the radio frequency signals and allow the passage of the control pulse on control lines 11 and 12.

In order to better understand the principle of the invention, factors affecting or limiting operation of a coaxial diode switch are now considered. There are five basic limitations on the time required to switch a coaxial diode switch from one state to the other: (1) the rise time of the control pulse; (2) the switching time of the diode element; (3) the bandwidth of the control line; (4) the bandwidth of the switch junction; and (5) the voltage standing wave ratio of the control line when the switch junction is "open" so as to block radio frequency signals. The rise time of the control pulse necessarily must be less than the switching time of the entire junction. The switching time of the diode element in the junction should be less than the rise time of the control pulse. The bandwidth of the control line should be sufficiently broad to pass the frequency components which comprise the control pulse. The bandwidth of the entire switch junction including the diode and the means of connecting the diode to the center conductor should be sufficiently broad to pass the radio frequency signal to be switched and the modulation frequency sidebands as will be described below. Finally, the control line should have a low VSWR; i.e. a good match should be obtained between the main transmission line 1 and input and output control lines 17 and 18 when the switch junction is "open" to block radio frequency signals.

The first two limitations are determined by availability of components to satisfy them and lie outside the scope of this invention. Assuming a control pulse with the requisite rise time and a diode capable of switching conduction states in the order of a nanosecond or less, there still remains to be satisfied the last three of the above named limitations.

The bandwith of the control line, including the input and output lines 11 and 12, respectively, should be sufficiently broad to pass all of the frequency components between D.C. and the upper frequency determined by the rise time of the control pulse. The upper frequency that should be passed to reproduce a control pulse having a rise time $t$ is $$f \approx \frac{0.35}{t} \text{ to } \frac{0.45}{t} \qquad (1)$$

See "Automatic Feedback Control Systems," by J. G. Truxall, page 80 (McGraw-Hill Book Company, Inc., 1955). If any of the frequency components which comprise the control pulse are removed or blocked the length of time required for the pulse to rise to the actuating amplitude; i.e., the pulse rise time, increases. In accordance with this invention the entire control circuit, including output line 12, is constructed to pass all frequency components comprising the control pulse to provide a complete return circuit for the pulse by connection of load termination 23 to outer conductor 15′ of line 12. Filters 17 and 18 therefore pass the control pulse while blocking the incident radio frequency signals. In short, a complete path is provided for the control pulse so that incident components make one pass through the switch junction and substantially no reflections of the components are present to lengthen the switching time of the junction.

The switch junction 10 is designed to have a bandwidth sufficiently broad to pass the radio frequency signals to be switched and the frequency components comprising the control pulse. More particularly, the incident radio frequency signal and the frequency components of the control pulse combine to produce a radio frequency signal having a modulation envelope extending between $f_0-f_u$ and $f_0+f_u$, where $f_0$ is the center frequency over which the switch is to operate and $f_u$ is the upper frequency of the control pulse as determined by Equation 1. The width of the radio frequency modulation envelope is twice the bandwidth of the control pulse. For example, a 4 gc. radio frequency signal with a control pulse having a rise time of 0.4 nanosecond ($f_u=1$ gc.) would have substantial amounts of power extending over a frequency range from approximately 3 gc. to approximately 5 gc. If the junction bandwidth is not sufficient to pass all frequency components of the control pulse the switching time is increased. In order to achieve the bandwidth required for switching times in the order of a few nanoseconds the junction 10 is constructed as shown in FIGURE 3. The junction consists of a diode 26 comprising whisker 27 projecting from semiconductor material 29 and contained in encapsulation body 30. Leads 32 and 33 connect to and extend axially from whisker 27 and semiconductor material 29, respectively. Center conductor 2 is severed to provide gap 4 defined by end faces 35 and 36. These adjacent ends of the center conductor are hollowed out to form cylindrical recesses 37 and 38 within which portions of encapsulation body 30 and leads 32 and 33, respectively, extend. Conductor blocks 39 and 40 are disposed in the recesses 37 and 38, respectively, to slide axially therein. The blocks make electrical contact with the walls of the center conductor and with respective leads 32 and 33, center openings 41 being provided in the blocks to receive the leads. As blocks 39 and 40 are moved axially, the electrical lengths of leads 32 and 33, and thus their inductances, are changed. Access to blocks 39 and 40 for such adjustment is provided by longitudinal slots 43 and 44 formed in inner conductor 2 and outer conductor 3, respectively, over a portion of the length of the junction.

The capacitance formed by end faces 35 and 36 of the severed center conductor and the dielectric (air) therebetween is adjusted by means of a coaxial sleeve capacitor comprising an inner dielectric sleeve 46 and an outer metal sleeve 47. Dielectric sleeve 46 preferably is fixed to adjacent ends of the center conductor and is longer than the outer sleeve 47. Adjustment of the capacitance of gap 4 is made by moving the metal sleeve 47 axially over the gap so as to change the capacitance between the sleeve 47 and the center conductor 2 which is in parallel with the capacitance of gap 4. As shown in FIGURE 3*a*, movement of sleeve 47, as depicted by the dotted line, by the distance X decreases the capacitance between the center conductor and the sleeve on the right side of the gap and increases the corresponding capacitance on the left side of the gap. Since these capacitances are in parallel with the gap capacitance and in series with each other, the overall effect is to change the gap capacitance. Access to sleeve 47 for this adjustment may be had through slot 44 in the outer conductor.

Selective variation of the inductance of leads 32 and 33 and the net capacitance of gap 4 and sleeve 47 permit adjustment of the switch parameters so as to obtain the desired junction bandwidth.

Figure 4:
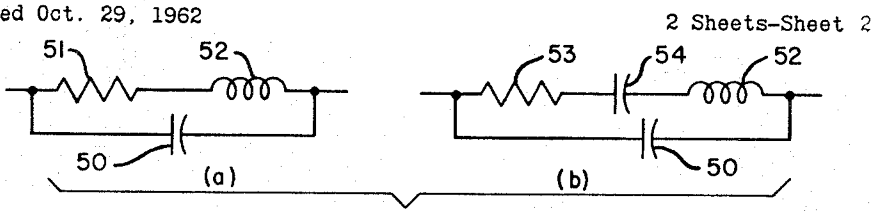
Figure 5:
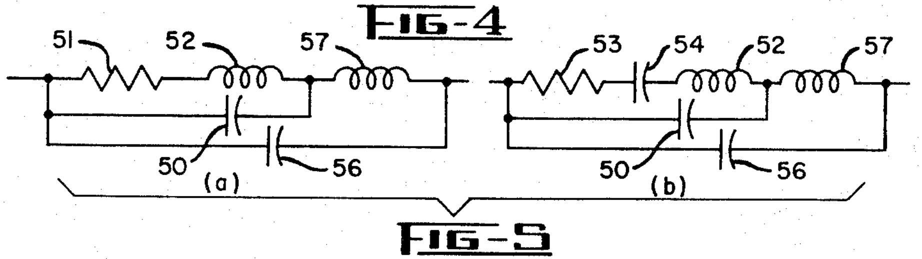

The operation of the switch junction will be more clearly understood by reference to the circuit equivalents of the diode and switch junction shown in FIGURES 4 and 5. FIGURES 4*a* and 4*b* are circuit equivalents of a typical semiconductor diode 26 in the forward biased and reverse biased states, respectively. When biased in the forward direction so as to conduct, the diode is represented by cartridge capacitance 50 in shunt with the series combination of a resistance 51 and whisker inductance 52. In the reverse bias state, FIGURE *4b*, the diode appears as cartridge capacitance 50 in shunt with the series combination of a resistance 53, depletion layer capacitance 54 and whisker inductance 52. Depletion layer capacitance 54 is the effective capacitance caused by the relative positioning of the electrons and holes in the semiconductor material when the diode is reverse biased.

The circuit equivalent of the switch junction as shown in FIGURES *5a* and *5b* comprises the equivalent circuit of FIGURE 4 with additional parameters. In order to block the passage of a radio frequency signal on coaxial transmission line 1, center conductor 2 should be "opened" or the center conductor should present a high impedance in series with the line in order to provide a severe mismatch to reflect the incident signal back to the input. A high impedance resonant circuit is obtained from switch junction 10 when diode 26 is forward biased by the addition of a predetermined inductance 57 in series with whisker inductance 52 and a predetermined capacitance 56 in shunt with this circuit.

In order that a radio frequency signal on the coaxial transmission line 1 passes through the junction, the impedance in series with center conductor 2 should be minimum. Switch junction 10 has minimum series impedance when diode 26 is reverse biased, see FIGURE *5b*. Junction 10 operates as a series resonant circuit with a low impedance at resonance by the addition of the predetermined inductance 57 in series with depletion layer capacitance 54 and whisker inductance 52.

The amount of additional capacitance 56 and inductance 57 required to achieve the desired resonant conditions for junction 10 are achieved by means of the capacitance of gap 4 which is adjusted by positioning of sleeves 46 and 47, and by the inductance of leads 32 and 33 which are adjusted by the positioning of blocks 39 and 40. These capacitor and inductor values may be calculated to provide approximate physical dimensions for construction of the switch junction. The exact parameters and physical dimensions of the junction may be determined empirically by actual measurements on physical embodiments.

It can be shown that when diode 26 is reverse biased the fractional bandwidth of switch junction 10 is $$\frac{f_2-f_1}{f_0}=\frac{2Z_0+r_sZ_0}{X_0Z_0}=\frac{1}{Q}=\frac{2}{X_0} \quad (2)$$

where $f_2$ and $f_1$ are the upper and lower frequency limits of the circuit, respectively, $f_0$ is the center frequency over which the switch is to operate $Z_0$ is the characteristic impedance of control line 1, $r_sZ_0$ is the resistance of resistance 53, $r_s$ is the normalized resistance of resistance 53, $X_0Z_0$ is the reactance of depletion layer capacitance 54 at the resonance frequency $f_0$, $X_0$ is the normalized capacitance of depletion layer capacitance 54 and equal to $$\frac{1}{2\pi f_0 C Z_0}$$

where C is the depletion layer capacitance 54, and Q is the quality factor of the circuit. Measurements of the microwave impedance of some diodes show that $r_s$ is much less than 2 and the bandwidth of the circuit is very nearly independent of circuit losses. Similarly, it can be shown that when diode 26 is forward biased, the fractional bandwidth of the switch junction 10 is $$\frac{f_2-f_1}{f_0}=\frac{r_pZ_0}{X_0Z_0}=\frac{1}{Q} \quad (3)$$

where $r_pZ_0$ is the resistance of resistor 51 and $r_p$ is the normalized resistance of resistance 51, the other terms being defined above. Thus, a switch junction having the requisite bandwidth to pass the radio frequency signal and the frequency components of the control pulse is obtained.

The minimum switching time of the above described coaxial switch is related to the bandwidth of the control lines. Referring now to FIGURE 2, the pass band of low-pass filters 17 and 18 is sufficiently broad to pass all the frequency components present in a pulse having a predetermined rise time. This insures that the rise time of the pulse applied across the diode is as short as the rise time of the pulse generated by the pulse forming network. The low-pass filters 17 and 18 additionally have a stop band to block the radio frequency signal from the control lines.

The voltage standing wave ratio of both the output control line and the input control line should be relatively low and should be matched to coaxial line 1 when diode 26 is forward biased; when the switch is "open." The matching of both control lines 11 and 12 insures that all frequency components comprising a control pulse having a particular rise time will be passed through the control circuit without reflection when the diode is in its forward biased conduction state. Since full switching of the diode does not occur until reflections have subsided, the finite interval of time required for reflections to subside lengthens the time required for the control pulse to reach its peak triggering amplitude. Prevention of such reflections is provided in the circuit of FIGURE 2 through proper termination of the control line, and more particularly termination of output control line 12 in load 23 having a characteristic impedance equal to that of the transmission line. Other components in the control line are likewise designed to have the same characteristic impedance as transmission line 1. High-pass filters 20 and 21 present an open circuit to frequency components of the control pulse to match control lines 11 and 12 to the transmission 1.

An actual embodiment of the circuit of FIGURE 2 is shown in FIGURE 6. The assembly consists of substantially identical plates 60 and 61, each having a pair of semi-cylindrical parallel grooves 62 and 63 which intersect a third semi-cylindrical groove 64 at right angles. The semi-cylindrical surfaces defining grooves 62 and 63 correspond to the outer conductors 15 and 15' of control lines 11 and 12, respectively, and the surface of groove 64 corresponds to the outer conductor 3 of the coaxial transmission line 1. Rods disposed within these grooves comprise the center conductors of the coaxial lines. High-pass filters 20 and 21, low-pass filters 17 and 18 and the switching junction 10 are connected in the center conductors as shown. Spacer 66 and the filters locate the center conductors symmetrically within the grooves and standard coaxial connectors 68, 69, and 70 provide connections for the switch to external circuits. Slot 44 in plate 60 and 61 and slot 43 in the center conductor 2 provide access to enable adjustment of sleeve 47 and blocks 39 and 40.

A modified form of the invention which provides for a shorter rise time is shown in FIGURE 7 and differs from the embodiment of FIGURE 2 in having two switch junctions 10 and 10'. The two junctions 10 and 10' are spaced apart by a distance equal to a quarter wavelength at the center frequency of the radio frequency signal and are placed in series with center conductor 2 of coaxial transmission line 1. The switch junctions are actuated simultaneously by a control pulse from input control line 11 connected to the main transmission line midway between the switch junctions. The circuit path for the control pulse through the switch junctions is completed through output control lines 12 and 13, each having a low-pass filter 18 and termination 23 and having a common connection to the outer conductors of the lines.

The quarter wavelength section of coaxial transmission line 72 between switch junctions 10 and 10' is an impedance inverter. When the diodes comprising switch junctions 10 and 10' are reverse biased so as to "close" the switches, the impedance looking into switch junction 10' transformed back to switch junction 10 (by line 72) is such as to match to the line the impedance looking into junction 10. When the diodes are forward biased to "open" the switches, the impedance of switch junction 10' is much greater than the load impedance and a low impedance is transformed back to switch junction 10. More particularly, the impedance transformed from junction 10′ is much less than the impedance of junction 10. Thus, high attenuation is obtained on coaxial line 1 over a broader frequency band and the effective bandwidth of the switch junction is increased to provide a switch with faster switching time.

By way of example, a switch embodying our invention, having the following dimensions and characteristics, has been constructed and successfully operated:

| | |
|---|---|
| (1) Length (less connectors) | 2¼″. |
| (2) Width (less connectors) | 2¼″. |
| (3) Depth | ½″. |
| (4) Materials of plates | Aluminum. |
| (5) Weight | Less than 6 ounces. |
| (6) Diode—Fairchild | FD 600. |
| (7) Forward bias current | 15 ma. |
| (8) Reverse bias potential | 10 v. |
| (9) Power input (peak) | 20 mw. |
| (10) Bandwidth of junction | 0.6 gc. |
| (11) Operating frequency | 4.0 gc.–4.6 gc. |
| (12) Control pulse rise time | Less than 4 ns. |
| (13) Control pulse upper freq. | 100 mc. |
| (14) Low-pass filter cutoff | 1 gc. |
| (15) High-pass filter cutoff | 4 gc. |
| (16) Switching time ("closed to open") | Less than 4 ns. |
| (17) Insertion loss | Less than 1 db. |
| (18) Isolation | 50 db (at band center) greater than 30 db (4.0 gc. to 4.6 gc.). |
| (19) Power input (peak) (no degradation in performance) | 1 w. |
| (20) Power input (peak) (Insertion loss≈2 db) | 25 w. |

What is claimed is:

1. A fast acting radio frequency switch assembly comprising
   a first radio frequency transmission line adapted to transmit radio frequency signals to be controlled,
   a pair of substantially identical multi-element high-pass radio frequency filters electrically connected to said first transmission line and spaced apart in the direction of signal transmission, said high-pass filters being adapted to block and to pass signals having respective frequencies below and above a predetermined cutoff frequency,
   a switch junction in and matched to said first transmission line between said high-pass filters, said junction having first and second operating states for respectively blocking and passing signals on said line, and
   a control circuit for actuating said junction to change from one operating state to the other comprising
      an input transmission line connected to said first transmission line between said junction and one of said high-pass filters,
      an output transmission line connected to said first transmission line between said junction and the other of said high-pass filters,
      a multi-element low-pass filter in each of said input and output transmission lines adapted to block signals having frequencies above a predetermined cutoff frequency and to pass without reflection substantially all frequency components below the predetermined cutoff frequency comprising the control pulse,
      switch junction bias and control pulse voltage means connected to said input transmission line on the side of the low-pass filter therein opposite from the first transmission line, said bias and control voltage means being matched to said input transmission line for generating and passing without reflection a control pulse having a predetermined rise time and fall time for switching said switch junction between said operating states,
   said multi-element low-pass filters being matched to said transmission lines for passing without reflection substantially all frequency components comprising said control pulse,
   said switch junction and said input and output transmission lines being matched to said first transmission line for passing without reflection substantially all frequency components comprising said control pulse, and
   load means connected to the terminal and of said output transmission line on the side of the low-pass filter therein opposite from the first transsion line, said load means being matched to first transmission line for passing without reflection substantially all frequency components comprising said control pulse.

2. A fast acting radio frequency switch assembly comprising
   a first coaxial transmission line adapted to transmit radio frequency signals to be controlled, and having a center conductor,
   a pair of substantially identical multi-element high-pass radio frequency filters electrically connected to said first coaxial transmission line and physically spaced apart in the direction of signal transmission, said high-pass filters being adapted to block and to pass signals having respective frequencies below and above a predetermined cutoff frequency,
   a diode switch junction connected in series with said center conductor of and matched to said first coaxial transmission line between said high-pass filters, said junction having first and second resonant operating states for respectively blocking and passing signals on said first coaxial transmission line, and
   a control circuit for actuating said diode switch junction to change from one resonant operating state to the other comprising
      an input coaxial transmission line having an inner and outer conductor, said input transmission line connected to said first coaxial transmission line between said diode switch junction and one of said high-pass filters,
      an output coaxial transmission line connected to said first coaxial transmission line between said diode switch junction and the other of said high-pass filters,
      a multi-element low-pass filter in each of said input and output coaxial transmission lines and adapted to block and to pass signals having respective frequencies above and below a predetermined cutoff frequency, diode bias and control pulse voltage means connected between the inner and outer conductors of said input coaxial transmission line on the side of the low-pass filter therein opposite from the first coaxial transmission line, said bias and control voltage means being matched to said input transmission line for generating and passing without reflection a control pulse having a predetermined rise time and fall time for switching said diode switch junction between said resonant operating states,
   said multi-element filters being matched to said transmission lines for passing without reflection substantially all frequency components comprising said control pulse,
   said diode switch junction and said input and output coaxial transmission lines being matched to said first transmission line for passing without reflection substantially all frequency components comprising said control pulse, and load means connected to the end of said output coaxial transmission line on the side of the low-pass filter therein opposite from the first coaxial transmission line, said load means being matched to said first coaxial transmission line for passing without reflection substantially all frequency components comprising said control pulse.

3. A microwave switch assembly comprising a first coaxial line adapted to be connected to associated microwave circuits to be controlled and having a center conductor severed to form a gap, a diode connected to said center conductor across the gap and having first and second operating states for respectively opening and closing the switch, circuit means for changing the operating state of said diode comprising second and third coaxial lines having center conductors connected to the center conductor of the first line on opposite sides respectively of said diode, a source of diode actuating voltage connected to said second line, a matched load connected to the end of said third line, and means for isolating said associated circuits from the diode actuating voltage and for isolating said second and third coaxial lines from signals passing through the first line from and to said associated circuits.

4. A microwave switch assembly comprising a first coaxial line having a center conductor severed to form a gap between center conductor end portions, a diode having leads connected between said center conductor end portions, means for adjusting the electrical length of said leads to vary the series inductance thereof, means for adjusting the capacitance of said gap, circuit means for changing the operating state of said diode to open or to close the switch comprising second and third coaxial lines having center conductors connected to the center conductor of the first line on opposite sides, respectively, of said diode, a source of diode actuating voltage connected to said second line, a matched load connected to the end of said third line, and microwave filters for isolating said associated circuits from the diode actuating voltage and for isolating said second and third coaxial lines from signals passing through the first line from and to said associated circuits.

5. The assembly according to claim 4 in which one of said center conductor end portions has a longitudinal recess opening into said gap, at least one of said leads extending into said recess and being electrically connected to the side of said recess, said electrical connection of said one lead within said recess being axially adjustable whereby to vary the effective electrical length of the lead.

6. A microwave switch assembly comprising a first coaxial line having an outer conductor and an inner conductor and being adapted to be connected to associated microwave circuits to be controlled, said center conductor being severed to define end portions axially spaced apart to form a gap therebetween, each of said end portions having a longitudinal recess opening into said gap, a diode element extending internally of and across said gap and into said recesses, a pair of leads electrically connected to opposite ends, respectively, of said diode element and to said end portions, means for adjusting the effective electrical lengths of said leads, means for adjusting the effective capacitance of the center conductor ends at the gap, circuit means for changing the operating states of said diode for opening and closing the switch comprising second and third coaxial lines having center conductors connected to the center conductor of the first line on opposite sides, respectively, of said diode, a source of diode actuating voltage connected to said second line, a matched load connected to the end of said third line, and means for isolating said associated circuits from the diode actuating voltage and for isolating said second and third coaxial lines from signals passing through the first line from said associated circuits.

7. In a microwave switch of the type described, a coaxial line having an outer conductor and a center conductor severed to define axially aligned end portions, said end portions being axially spaced apart to form a gap therebetween, each of said end portions having a longitudinal recess opening into said gap, a diode element extending internally of and across said gap and into said recesses, a pair of leads electrically connected to opposite ends, respectively, of said diode element and extending into respective ones of said recesses, a shorting member in each recess electrically connecting the adjacent lead to the wall of the recess, said shorting member being slidable longitudinally in the recess for adjustment of the effective electrical length of the lead, and means for adjusting the effective capacitance of the center conductor at the gap comprising a sleeve of dielectric material having a length greater than the gap length and disposed over the gap and the end portions of the center conductor, and a conducting sleeve circumscribing the dielectric sleeve and having a length less than that of the dielectric sleeve and greater than that of the gap whereby to overlap said end portions of the center conductor, said conducting sleeve being axially movable relative to the center conductor end portions whereby to decrease the area of overlap with one end portion and to increase the area of overlap with the other end portion.

8. A fast acting radio frequency switch assembly comprising a first coaxial line adapted to transmit radio frequency signals to be controlled and having a center conductor severed to form a capacitive gap, means for adjusting the capacitance of said gap, a pair of substantially identical high-pass radio frequency filters electrically connected to said line and physically spaced apart in the direction of signal transmission, said filters being adapted to block and to pass signals having respective frequencies below and above a predetermined cutoff frequency, a diode connected in series with a center conductor of said coaxial line between said filters, said diode having leads connected in series with said gap and having first and second operating states for respectively blocking and passing signals on said line, means for adjusting the electrical length of said leads for varying the series inductance thereof, and a control circuit for actuating said diode to change from one operating state to the other comprising an input coaxial line connected to said first coaxial line between said diode and one of said filters, an output coaxial line connected to said first coaxial line between said diode and the other of said filters, a low-pass filter in each of said input and output coaxial lines adapted to block and to pass signals having respective frequencies above and below a predetermined cutoff frequency, diode bias and control voltage means connected to said input coaxial line on the side of said low-pass filter opposite from the first coaxial line, and load means connected to the end of said output line on the side of the low-pass filter therein opposite from the first coaxial line, said load means being matched to said first line.

References Cited by the Examiner

UNITED STATES PATENTS 2,981,832 4/61 Mattson ............. 307—88.5

ARTHUR GAUSS, *Primary Examiner.*